United States Patent [19]
Fennell

[11] 3,999,139
[45] Dec. 21, 1976

[54] MONOLITHIC ALTERNATELY STACKED IF AMPLIFIER

[75] Inventor: Robert D. Fennell, Fort Lauderdale, Fla.

[73] Assignee: Motorola, Inc., Schaumburg, Ill.

[22] Filed: Aug. 19, 1974

[21] Appl. No.: 498,348

[52] U.S. Cl. .................................. 330/16; 330/18; 330/22; 330/70

[51] Int. Cl.$^2$ .......................................... H03F 3/04

[58] Field of Search .................. 330/16, 18, 19, 22, 330/70, 71

[56] References Cited
UNITED STATES PATENTS

| | | | |
|---|---|---|---|
| 2,889,415 | 6/1959 | Hall | 330/70 |
| 3,872,392 | 3/1975 | Sakamoto et al. | 330/22 X |

*Primary Examiner*—R. V. Rolinec
*Assistant Examiner*—Lawrence J. Dahl
*Attorney, Agent, or Firm*—Vincent J. Rauner; Eugene A. Parsons; Phillip H. Melamed

[57] ABSTRACT

The IF amplifier combines the high frequency and low noise figure characteristics of a cascode stage with the large signal handling capability and accurate gain control of a direct emitter coupled amplifier controlled by a constant current source. The amplifier uses a technique of alternately stacked cascode stages which results in minimizing both the total current drain and the value of DC potential necessary to operate the amplifier. A current mirror, independent of power supply variation, is used to control the gain of the amplifier and is also used to provide temperature compensation for amplifier gain. Special bias techniques along with the current mirror minimize the variation of the amplifier gain with respect to DC power supply variations. Novel use of semiconductor devices minimizes the number of leadout connections on an I.C. chip needed for attaching large external bypass capacitors.

19 Claims, 4 Drawing Figures

MONOLITHIC ALTERNATELY STACKED IF AMPLIFIER

BACKGROUND OF THE INVENTION

Direct emitter coupled transistor amplifiers, with bias currents and gain controlled by a constant current source connected to the common emitter terminal, have been known before in the state of the art and are widely used in integrated circuits. Such amplifiers are noted for their large signal handling capabilities and their stable gain and bias level characteristics. Amplifiers of this type, however, have limited absolute values of noise figure and gain, due to the resistance and noise properties of the constant current source. Emitter coupled amplifiers also have a poor high frequency response due to the Miller capacitance effect, and are not economical in their use of current.

A transistor cascode stage, defined as a common emitter stage amplifier with its output directly connected to the input of a common base stage amplifier, is certainly well known in the state of the art. Cascode stages possess good high frequency response, low noise figure characteristics, and are economical in their use of current. However, cascode stages do not have large signal capabilities; and if biased by a constant current source, cascode stages possess stable gain characteristics, only if the input signal is small enough so that the operation of the constant current source is not materially disrupted.

A cascode stage has been combined with an emitter coupled transistor before, but only where the emitter coupled transistor has been connected to the output device of the cascode stage. The emitter coupled transistor is used as an AGC cntrol and preserves the current economy of a cascode configuration, but does not increase the signal handling capabilities of the cascode amplifier.

Connecting amplifiers in cascade is common and obtains the multiplication of the gain of individual amplifiers while permitting a direct coupled connection of the amplifiers. Cascade connections result in each amplifier drawing a separate current and therefore are not economical in their use of current. Cascode connection of amplifiers is also an old technique which is economical in current drain, but does not permit a direct coupling of individual stages. Cascode stacking of amplifiers also requires a higher value of voltage potential than an equivalent cascade connection of amplifiers.

SUMMARY OF THE INVENTION

An object of this invention is to increase the amplitude signal handling capabilities of a cascode stage while maintaining the high frequency response, low noise characteristics, and high gain of a cascode stage.

Another object of the invention is to illustrate a cascode amplifier with its gain controlled by a constant current source, where the constant current source is not disrupted by large signal inputs to the input stage of the cascode amplifier.

It is another object of this invention to use the current developed in an emitter coupled transistor, not part of the cascode stage, as a source of current to power an additional cascode amplifier stage that has its input directly connected to the output of the original cascode stage.

An additional object of this invention is to demonstrate that when two cascode stages are arranged in a cascade connection, a third cascode stage, having its input directly connected to the output of the second cascode stage, can be stacked on top of the first cascode stage; thus using the same current to power the first and third cascode stages, while minimizing the source of potential needed to power all three cascode stages.

A further object of this invention is to teach that the alternate stacking technique described can be applicable to common emitter stages instead of just cascode stages and would therefore have the same current saving and voltage minimizing effects as the stacked cascode stages to be herein described.

Still another object of this invention is to disclose an amplifier AC grounding and DC level shifting device, which will enable two points of circuitry having different DC levels to be connected to AC ground using only one capacitor.

A final object of this invention is to explain how a current mirror, substantially independent of power supply variations, and a voltage biasing technique, also substantially independent of power supply variations, when combined with an amplifier, can create an amplifier whose gain is substantially independent of power supply variations.

The present specification describes a cascode transistor stage with a direct emitter coupled transistor connected to the input transistor of the cascode pair, the biasing levels being determined by a constant current source connected to the emitter terminals of the emitter coupled transistor pair, and the emitter terminal of the input cascode transistor being coupled to ground by a capacitor. This structure provides the advantages of both a low noise cascode amplifier and a constant current controlled emitter coupled amplifier. The noise of the constant current source is effectively quieted by the RF capacitor to ground and the emitter coupled transistor provides large signal handling capabilities for the cascode stage without disturbing the operation of the constant current source. A constant voltage with respect to ground, developed through a series string of diodes, and a constant current, developed by a current mirror that operates independent of voltage supply value, are used to stablize the gain of the cascode amplifier with respect to power supply variations. Special use of diodes and transistors as devices for AC grounding connections and DC level shifting is also is also described where the diodes are also used in biasing a cascode amplifier. Also an embodiment is shown that directly DC couples three cascode stages in a cascade-cascode combination where the third cascode stage is stacked on top of the first cascode stage. This stacking structure minimizes the total current drain and the value of voltage supply needed to operate the three stage amplifier, while permitting direct coupling of three amplifier stages.

BRIEF DESCRIPTION OF THE DRAWINGS

Referring to the drawings.

DETAILED DESCRIPTION OF THE INVENTION

Figure 1:
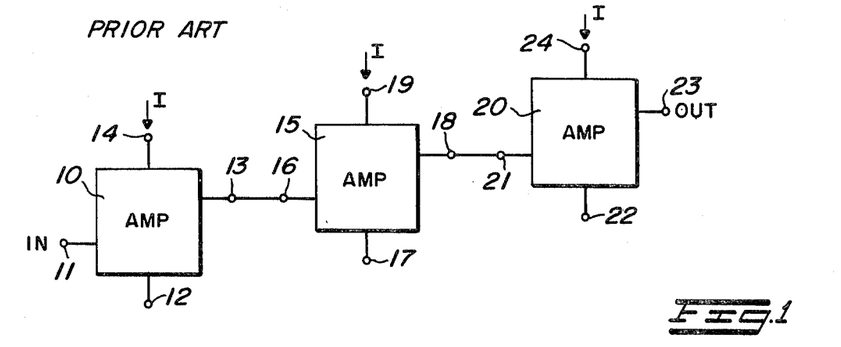
FIG. 1 is a block diagram of an amplifier unit illustrating the prior art cascade method of interconnecting three amplifier stages.

FIG. 1 shows a block diagram of three identical amplifier units 10, 15 and 20; and, therefore, because they are identical only amplifier 10 will be discussed in detail. Amplifier 10 consists of input terminal 11, output terminal 13, a first terminal 14 for receiving current, and a second terminal 12 for returning current. Substantially all of the current necessary to run amplifier 10 is received at terminal 14, and terminal 14 thus represents the highest source of potential in amplifier 10. Substantially all of the current in amplifier 10 leaves by terminal 12, and terminal 12 is therefore the lowest source of potential in amplifier 10. Terminals 16, 17, 18 and 19 of amplifier 15 and terminals 21, 22, 23 and 24 of amplifier 20, correspond to terminals 11, 12, 13 and 14 of amplifier 10 respectively.

A fixed amount of current, I, is necessary for the correct operation of each amplifier. When amplifier 10 is operated correctly; terminal 11 will be fixed DC voltage difference, A, above terminal 12, the voltage at terminal 13 will be a fixed level, B, above the voltage at terminal 11, and the voltage at terminal 14 will be a fixed level, C, above the voltage at terminal 13. Amplifier 10 could alternatively be defined with said first terminal being the current return and low potential terminal, and said second terminal being the current receiving and high potential terminal; and the definition of the relative voltage levels would be similar. The gain of amplifier 10 is G. The input terminal of amplifier 10 is assumed to draw negligable input current. The voltage level differences and gain described for amplifier 10 also correspond to the voltage level differences and gain for amplifiers 15 and 20.

A prior art direct coupled cascade connection of the amplifiers 10, 15 and 20 is illustrated in FIG. 1. Here output terminal 13 of amplifier 10 is connected to input terminal 16 of amplifier 15 and output terminal 18 of amplifier 15 is connected to input terminal 21 of amplifier 20. The effect is that the gain of all three amplifiers is multiplied together and therefore the total gain of the structure is $G^3$. The total current needed for operating the cascaded amplifiers is 3I and the voltage at terminal 24 (which is the highest potential needed for all three cascaded stages) is greater than the voltage at terminal 12 (which is the lowest potential of the three cascaded stages) by A+3B+C. Thus, a direct coupled cascade connection of three identical amplifiers uses a current of 3I and a voltage of A+3B+C in order to produce a gain of $G^3$.

Figure 2:
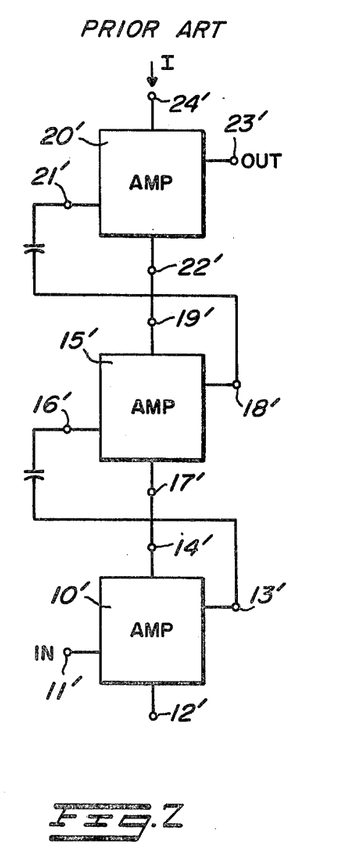
FIG. 2 is a block diagram of an amplifier unit illustrating the prior art cascode stacking method of interconnecting three amplifier stages.

FIG. 2 shows a prior art cascode-stacked configuration. Amplifiers 10', 15' and 20' are defined identically to amplifiers 10, 15 and 20; and the prime notation indicates a different interconnection configuration. In this configuration, terminal 14' of amplifier 10' is connected to terminal 17' of amplifier 15'. Output terminal 13' of amplifier 10' is connected through a coupling capacitor to input terminal 16' of amplifier 15'. The coupling capacitor is essential because terminal 14' (the highest potential in amplifier 10') and terminal 17' (the lowest potential in amplifier 15') are connected together. For correct operation, terminal 16' must be at a higher potential than terminal 17', however terminal 13' must be at a lower potential than terminal 14'; therefore, no direct coupling connection is possible between terminal 13' of amplifier 10' and terminal 16' of amplifier 15'. Similarly, terminal 19' of amplifier 15' is directly connected to terminal 22' of amplifier 20', and terminal 18' of amplifier 15' is connected through a coupling capacitor to terminal 21' of amplifier 20'. The result is a three stage amplifier with a gain of $G^3$ and a total current usage of I, not 3I as in the previous cascade stage; but the voltage needed at terminal 24' with respect to the voltage at terminal 12' is now 3A+3B+3C. Thus the cascode-stacked arrangement saves on total current drain, but greatly increases the amount of voltage being used to obtain a three stage amplification and eliminates any possibility of direct coupling between stages, which is a necessity in an integrated circuit configuration.

Figure 3:
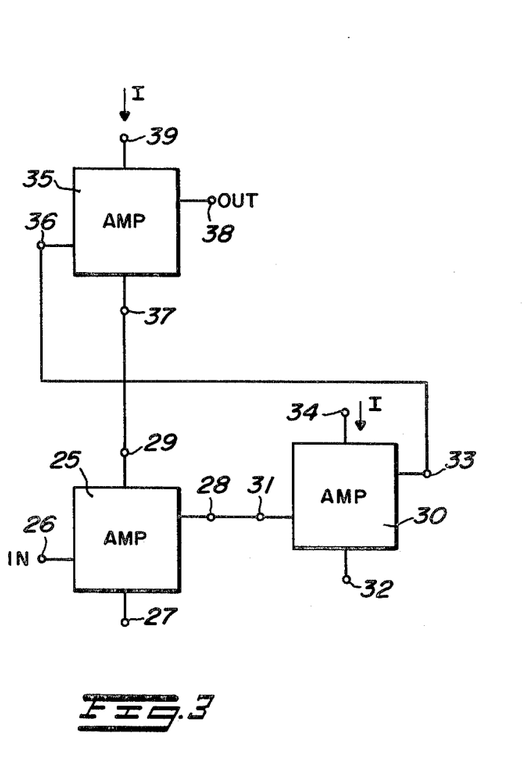
FIG. 3 is a block diagram of an amplifier unit illustrating a novel cascade-cascode stacking method of interconnecting three amplifier stages.

FIG. 3 shows a novel combined cascade-cascode configuration. Amplifiers 25, 30 and 35 are defined similarly to amplifier 10. Terminals 26, 27 28 and 29 of amplifier 25, terminals 31, 32, 33 and 34 of amplifier 30, and terminals 36, 37, 38 and 39 of amplifier 35 are defined to correspond respectively to terminals 11, 12, 13 and 14 of amplifier 10. Output terminal 28 of amplifier 25 is directly connected to input terminal 31 of amplifier 30. Output terminal 33 of amplifier 30 is directly connected to input terminal 36 of amplifier 35. Current receiving terminal 29 of amplifier 25 is connected to current returning terminal 37 of amplifier 35. The gain of this novel hybrid configuration is equal to $G^3$. The current necessary to operate this configuration is equal to 2I and the voltage difference between terminal 27 of amplifier 25 is A+3B+C, which is the same voltage difference that was obtained in the cascade configuration shown in FIG. 1. This new configuration uses only a current of 2I to operate three stages of amplification while maintaining direct coupling between the three stages. The configuration in FIG. 3 is plausible as long as B, the voltage difference between the input and output terminals of an individual amplifier, is equal to A+C. The configuration shown in FIG. 3 will also work whenever B is greater than A+C if terminals 29 and 37 are not directly connected together as shown in FIG. 3, but are connected by a load which develops a voltage of B—(A+C) when current I is passed through the load.

Therefore a combined cascade-cascode amplifier configuration has been shown which reduces the total amount of current necessary in a cascade configuration to operate three stages of amplification, which directly couples all three stages of amplification and which minimizes the voltage required in a cascode-stacked configuration between the highest and lowest potentials in the amplifier configuration. Obviously this principle can be extended to stacking a fourth amplifier on top of amplifier 30 and then stacking a fifth amplifier on top of amplifier 35, etc. The actual internal configuration of the three identical amplifiers that are shown in FIG. 3 can be anything, i.e. a common emitter amplifier stage or a cascode transistor pair amplifier, as long as the amplifiers comply with the previous definition of amplifier 10. Also the three amplifiers shown in FIG. 3 need not be identical as long as each amplifier complies with the definition of amplifier 10.

Figure 4:
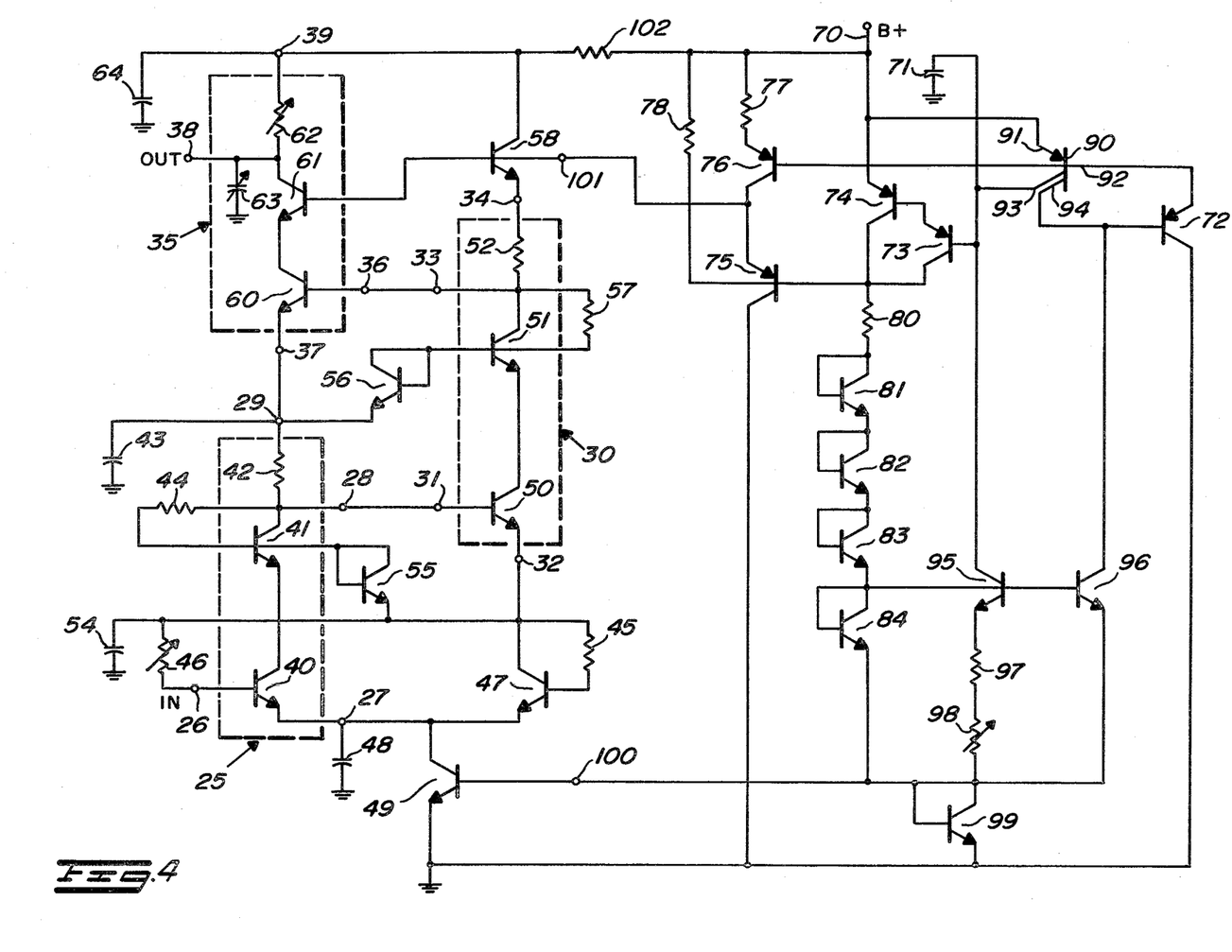
FIG. 4 is a schematic diagram of a monolithic integrated circuit illustrating an embodiment of the present invention.

FIG. 4 is a schematic diagram of a monolithic integrated circuit IF amplifier which has high gain, low noise, and large signal handling capabilities, and also incorporates the cascade-cascode stacking technique described above and shown in FIG. 3. The basic inventive ideas disclosed are not meant to be limited to integrated circuits or IF amplifiers but are especially useful in these types of circuits. This particular embodiment is an IF amplifier designed to work at a frequency of 5 to 22 MHz. Cascode amplifiers 25, 30 and 35 in FIG. 4 are embodiments of general amplifiers 25, 30 and 35 in FIG. 3, and are defined and connected identically.

The cascode amplifier stage generally referred to as amplifier 25 has four external terminals; terminal 26 which represents the input terminal, terminal 28 which represents the output terminal, terminal 29 which represents the receiving current terminal, and terminal 27 which represents the return current terminal. All bias and AC ground connections are considered external to the basic cascode amplifier stage 25. Amplifier 25 consists of an input transistor 40, an output transistor 41, and a resistor 42. In the description of this preferred embodiment all transistors are standard NPN transistors unless expressly stated otherwise, but the underlying inventive principles are not meant to be limited to NPN type transistors, and apply equally well if PNP transistors or F.E.T. devices are used. Transistor 40 has its base connected to terminal 26, its emitter connected to terminal 27, and its collector connected to the emitter of transistor 41. The collector of transistor 41 is directly connected to terminal 28, and is connected to terminal 29 through the resistor 42. This is the basic configuration of amplifier 25. Terminal 29 is coupled to ground through a capacitor 43. The collector of transistor 41 is connected to the base of transistor 41 through a resistor 44, thus resistor 44 provides base current for transistor 41. Terminal 27 is coupled to ground through a capacitor 48 and capacitor 48 enables transistor 40 to operate as an AC grounded common emitter stage.

A transistor 47 has its emitter connected to terminal 27. The collector of transistor 47 is coupled to the base of transistor 47 through a resistor 45, thus resistor 45 provides base current for transistor 47. A transistor 49 is used as a constant current source. Transistor 49 has its collector connected to terminal 27, its emitter connected to ground, and its base connected to a terminal 100. Terminal 100 receives a DC controlling voltage from current mirror circuitry to be described later. Transistor 49 is a 4x emitter transistor which means that for a given base emitter voltage, transistor 49 will draw four times the amount of emitter current that a single emitter transistor will draw. The 4x transistor can be analyzed as a transistor with four base emitter diodes in parallel. Multiple emitter transistors of this type are used to control large currents by using small base emitter voltages. Terminal 26 is connected to the collector of transistor 47 through a resistor 46, which is an adjustable resistor and provides base current for transistor 40. The collector of transistor 47 is coupled to ground through a capacitor 54. Diode 55, which in this embodiment is a transistor with its base and collector leads shorted together, has its anode connected to the base of transistor 41 and its cathode connected to the collector of transistor 47.

From the above recited structure, the operation of cascode stage 25 can now be explained. A cascode stage is a common emitter stage feeding a common base stage. The IF input signal presented at terminal 26 receives the AC amplification of the cascode stage 25 and the output gain of this cascode stage is presented at terminal 28. The gain relationship for a cascode transistor pair can be approximated by (1) $A_v$ $R_L/r_e$, which says that the voltage gain, $A_v$, is equal to the load resistance, $R_L$, divided by the emitter resistance of the input transistor, $r_e$. The emitter current of a transistor determines the effective value of $r_e$ as given by equation (2) $r_e = (kT/q) I_e$, which reduces to $r_e = 26$ milivolts/$I_e$, at room temperature. The dependence of voltage gain on emitter current is clear by comparing equations 1 and 2. The voltage gain of cascode stage 25 is equal to the ratio of the load resistance to $r_e$, where $r_e$ is equal to the emitter resistance of input transistor 40, and $I_e$ is the emitter current of input transistor 40. The emitter current of the input transistor is also substantially equal to the emitter current of the output transistor in a cascode configuration. The load resistance is the AC load connected to the collector of the output transistor, and in this case is equal to resistor 42, as long as nothing else connected to terminal 28 appreciably changes the AC load on the collector of transistor 41. Connecting the base of a subsequent grounded common emitter stage to the collector of transistor 41 will not change the AC load on transistor 41, as long as resistor 42 is low enough in resistance compared to the input impedance of the grounded common emitter stage. Transistor 49 acts as a constant current source controlled by the voltage at terminal 100 and determines the combined amount of emitter current which flows in transistors 40 and 47. Transistors 40 and 47 have their emitters coupled together and have similar transistor characteristics, since they are both made at the same time using the same geometry. Thus the current flowing in the collector of transistor 49 will divide approximately equally between transistors 40 and 47. Resistor 46 is used as a fine tuner adjustment to insure exact equal current division. Therefore the voltage gain of cascode stage 25 (which is equal to resistor 42 over $r_e$) is held constant because $r_e$ (which depends only on temperature and emitter current) is also held constant for a constant temperature. Capacitor 48 insures that transistor 40 will act as an AC grounded common emitter stage. Diode connected transistor 55 couples the base of transistor 41 to the collector of transistor 47, which is coupled to ground through capacitor 54 and therefore acts to AC ground the base of transistor 41, thus making transistor 41 a grounded common base stage.

The advantages of this structure are that the gain of the cascode stage 25 is totally controlled by the constant current source represented as transistor 49 and large amplitude input signals present at terminal 26 do not destroy the constant current action of transistor 49, since another path, represented by the current flowing through transistor 47, is provided. This additional current path will prevent transistor 49 from saturating and causing nonlinear distortion of the wave form when a large signal is present at the base of transistor 40. The noise of the constant current source, transistor 49, is eliminated by AC bypass capacitor 48 and this insures a low noise cascode stage controlled by a constant current source which has excellent large signal characteristics. Capacitor 48 also shunts the AC resistance of the constant current source and prevents this resistance from having any effect on the cascode gain. Resistor 46 is adjusted for an exactly equal division of current between transistors 40 and 47 because this will enable the largest possible positive and negative signals to be present at terminal 26 without disturbing the operation of constant current source transistor 49. The exact current division is maintained constant over temperature variations because of the equal transistor characteristics of transistors 40 and 47 and the fact that both transistors receive their base bias currents from the same voltage point, the collector of transistor 47.

Diode connected transistor 55 is used as a semiconductor device to create a constant DC level difference between the collector of transistor 47 and the base of transistor 41 while at the same time providing a low AC path between the base of transistor 41 and capacitor 54. The advantage of this device is that it eliminates the need for an additional capacitor to be used to AC couple the base of transistor 41 to ground while maintaining a constant DC level shift between the base of transistor 41 and the collector of transistor 47. If the circuit is made on a monolithic integrated circuit chip, the effect of diode connected transistor 55 is to eliminate the requirement for a separate leadout connection. Thus diode connected transistor 55 and capacitor 54 make up an AC coupling means for connecting the collector of transistor 47 and the base of transistor 41 to AC ground while maintaining a constant DC voltage difference between said base and collector.

A further improvement in noise figure is obtained by making transistor 40 a double striped base transistor. Double striped base transistors have more base metallization and present a lower base spreading resistance which gives them an inherently better noise figure. Transistor 47 must then also be made a double striped base transistor to maintain the equal current division between transistors 47 and 40, since both transistors must have similar characteristics. Thus devices 40 and 47 have been selected because of their low noise and IF frequency amplification characteristics.

Terminal 29 is coupled to ground through capacitor 43, and the output of cascode stage 25 represented at terminal 28 will couple into terminal 31, which is the input terminal of cascode stage 30. The bypassing of terminal 29 to ground by an RF capacitor and the high input impedance of the second cascode stage of terminal 31, preserves the initial assumption that the only AC load on output cascode transistor 41 of amplifier 25 is resistor 42. Thus additional stacking of cascode amplifiers will not cause any of the prior analysis to be in error.

In FIG. 4 cascode amplifiers generally referred to as amplifiers 30 and 35 also have four basic terminals and are defined similarly to cascode stage 25; again all bias and AC ground connections are considered external to the basic cascode amplifiers. Terminals 31, 32, 33 and 34 of amplifier 30, and terminals 36, 37, 38 and 39 of amplifier 35 are defined to correspond to terminals 26, 27, 28 and 29 of amplifier 25 respectively. Cascode stage 30 consists of transistors 50 and 51 and a resistor 52. Transistor 50 has its base connected to terminal 31, its emitter connected to terminal 32, and its collector connected to the emitter of transistor 51. The collector of transistor 51 is connected to terminal 33 directly and is connected to terminal 34 through resistor 52. This defines the basic configuration of cascode amplifier 30. Input terminal 31 of amplifier 30 is connected to output terminal 28 of amplifier 25, and current return terminal 32 of amplifier 30 is connected to the collector of transistor 47. Cascode stage 35 consists of transistors 60 and 61, a resistor 62 and a capacitor 63. Transistor 60 has its base connected to terminal 36, its emitter connected to terminal 37, and its collector connected to the emitter of transistor 61. The collector of transistor 61 is directly connected to terminal 38, connected through variable resistor 62 to terminal 39, and connected to ground through variable capacitor 63. Input terminal 36 connected to output terminal 33, and current return terminal 37 is connected to current receiving terminal 29. The base of transistor 51 is connected directly to the anode of a diode connected transistor 56, and is connected to the collector of transistor 51 through a resistor 57. The cathode of diode connected transistor 56 is connected to terminal 29.

Terminal 39 is coupled to ground through a capacitor 64. A transistor 58 has its base connected to a terminal 101 and the base of transistor 61, its collector connected to terminal 39, and its emitter connected to terminal 34. Terminal 101 receives a DC reference voltage which is independent of power supply variation, is coupled to AC ground, and has a voltage high enough to bias transistors 40, 41 47, 49, 50, 51, 58, 60 and 61. The source of the DC reference voltage which terminal 101 receives will be explained later when the operation of the current mirror feedback circuitry is explained. Terminal 39 is connected to terminal 70 through resistor 102, and terminal 70 is the voltage power supply input terminal to the entire circuit.

From the above-recited structure the operation of stacked cascode amplifiers 25, 30 and 35 can now be analyzed. The input IF frequency signal present at terminal 26 is amplified by cascode amplifier 25, and the output of cascode amplifier 25, present at terminal 28, is connected to input terminal 31 of cascode amplifier 30. The output of cascode amplifier 30, present at terminal 3, is then coupled to input terminal 36 of cascode amplifier 35, and the output of cascode amplifier 35 is obtained from terminal 38. The voltage gain of cascode amplifier 30 is equal to the ratio of resistor 52 to $r_e$, where $r_e$ is determined by the emitter current of transistor 50. Resistor 52 is the AC load of cascode stage 30, since terminal 34 is only a fixed DC diode drop away from terminal 101 which is assumed to be at AC ground. Thus again a semiconductor device is used to couple a point in the circuit to AC ground while maintaining a fixed DC offset. The base of transistor 61 is also AC coupled to ground, since it is directly attached to terminal 101. This permits transistor 61 to act as a grounded base stage. The emitter current of transistor 50 is approximately equal to the emitter current of transistor 40. This is shown from: the emitter current of transistor 50 being equal to the collector current of transistor 47, since resistors 45 and 46 draw negligable current; the collector current of transistor 47 being approximately equal to the emitter current of transistor 47 because the base current of transistor 47 is negligable; and the emitter current of transistor 47 being equal to the emitter current of transistor 40, since this relationship was previously determined by adjusting resistor 46. In the foregoing analysis diode connected transistor 55 was considered to draw negligable current. Therefore the value of $r_e$ of transistor 50 is equal to the value of $r_e$ of transistor 40. By similar analysis the value of $r_e$ of transistor 60 can be shown to be equal to the value of $r_e$ of transistor 50 and the value of $r_e$ of transistor 40, by assuming that diode connected transistor 56 draws negligable current and that the base currents drawn by transistors 40, 41 and 50 are also negligable. Thus the value of $r_e$ is the same for transistors 40, 50 and 60. The voltage gain of cascode stage 35 is the ratio of the impedance of resistor 62 and capacitor 63 to $r_e$ of transistor 60. Components 62 and 63 are made variable in the present embodiment so that the output impedance of cascode stage 35 can be made to match the input impedance of the next stage. Components 62 and 63 are external to the monolithic IC circuit. The base of transistor 51 is coupled to AC ground through diode connected transistor 56 and diode 56 operates in an identical manner as diode connected transistor 55, which was previously described. The cascade-cascode stacking technique of amplifiers 25, 30 and 35 in FIG. 4 is identical to the cascade-cascode stacking technique shown in FIG. 3. The current used in cascade stage 25 is also used in cascade stage 35 and the current flowing in transistor 47 is used as the current to power cascode stage 30.

Terminal 101 supplies a DC reference potential that is independent of power supply variations, which biases cascode stages 25, 30 and 35. This eliminates any base width modulation effect from changing the gain of cascode stages 25, 30 and 35. Base width modulation is a change in transistor conduction characteristics caused by a change in the reverse bias of the collector base junction of the transistor. When the collector base bias changes, the effective base width of the transistor changes and therefore so does the beta of the transistor. By making the bias levels of cascode stages 25, 30 and 35 practically independent of power supply variations, this insures that the beta of the biased devices will not change as a function of power supply voltage variation. While gain of a cascode stage does not appear as a direct function of beta, beta does relate to the collector current to emitter current ratio of a transistor and if this relation changes the gain of the cascode stage does change. In this embodiment the collector base junctions of transistors 40, 41, 47, 49, 50, 51 and 60 are maintained at a very small stable reverse bias. The bias is kept stable, by the stable DC reference potential supplied from terminal 101 through the base-emitter junctions of transistors 58 and 61, and the use of a constant current source (transistor 49). In addition to stable collector base bias a much more substantial factor in controlling the gain variation of cascode stages 25, 30 and 35, is that individual stage gains are determined by the constant current source, which is represented by transistor 49. The division of the constant current controlled by transistor 49 is kept equal because of the symmetrical transistor characteristics of transistors 40 and 47 and the fact that these transistors were originally adjusted by resistor 46 to have equal currents flowing through them. Resistor 102 is a small value resistor and is used to isolate the DC potential needed to operate the cascade amplifier stages previously described, from the DC potential used for generating constant control currents by a current mirror circuit.

The generation of currents independent of voltage supply value is accomplished by a current mirror feedback circuit, which will now be described. These voltage independent currents are used to establish the constant DC reference potential present at terminal 101 and the DC controlling potential present at terminal 100.

A transistor 90 in this particular embodiment is a PNP split ring collector transistor with emitter electrode 91, base electrode 92, electrode 93 being one collector of the split ring collector and electrode 94 being the other collector of the split ring collector. Emitter 91 is directly connected to a power supply terminal 70. Collector 93 is coupled to ground through capacitor 71. Capacitor 71 forms an RF bypass to prevent RF from disturbing the operation of the current mirror. Collector 93 is connected to the collector of a transistor 95 which is a 2x emitter NPN transistor. Collector 94 is connected to the collector of a transistor 96 which is a single emitter NPN transistor. Transistor 95 has its base directly connected to the base of transistor 96, and has its emitter connected to a first terminal of a resistor 97. The second terminal of resistor 97 is connected to a first terminal of a resistor 98, and the second terminal of resistor 98 is connected to the emitter of transistor 96 and the anode of a summing diode connected NPN transistor 99. The cathode of diode 99 is connected to ground. Base electrode 92 is connected to the emitter of a PNP transistor 72. Transistor 72 has its base connected to collector 94 and its collector connected to ground. Transistor 72 is a substrate PNP transistor. Base electrode 92 is also connected to the base of a transistor 76, which is a PNP ring collector transistor. Transistor 76 has its emitter coupled to terminal 70 through a resistor 77, and its collector connected to terminal 101. Terminal 101 is connected to the emitter of a transistor 75 which is a PNP substrate transistor. Transistor 75 has its collector connected to ground and its base coupled to terminal 70 through a resistor 78. A transistor 74, which is a PNP ring collector transistor, has its emitter connected to terminal 70 and its base connected to the emitter of a transistor 73 which is also a PNP ring collector transistor. Transistor 73 has its base connected to collector 93 and its collector connected to the collector of transistor 74 and the base of transistor 75. The base of transistor 75 is connected to the anode of a diode connected transistor 81 through a resistor 80. Diodes 81, 82, 83 and 84 are NPN transistors, each with its base connected to its collector. The cathode of diode 81 is connected to the anode of diode 82. The cathode of diode 82 is connected to the anode of diode 83. The cathode of diode 83 is connected to the anode of diode 84. The cathode of diode 84 is connected to the anode of diode connected transistor 99. The anode of diode 84 is connected to the base electrodes of transistors 95 and 96. The anode of diode connected transistor 99 is connected to terminal 100.

The operation of the bias network that supplies a DC reference potential to terminal 101 and DC controlling potential to terminal 100 can now be analyzed. The generation of currents independent of voltage supply value is accomplished by a current mirror feedback circuit. The feedback loop consists basically of; split ring collector PNP transistor 90, NPN 2x emitter transistor 95, NPN single emitter transistor 96 and resistors 97 and 98. The power supply terminal is directly connected to emitter 91. The base of transistor 90 is correctly biased by potential applied through resistor 77 and the forward biased base emitter junction of transistor 76. Collector 93 of transistor 90 receives DC potential through the forward biased base emitter junctions of transistors 74 and 73 and collector 94 of transistor 90 receives its DC potential through resistor 77 and the base emitter junctions of transistors 72 and 76. The base current of transistor 72 does not appreciably add to the collector current flowing from collector 94, and the base current of transistor 73 does not appreciably add to the collector current flowing from terminal 93. The basic property of the split ring collector that is used in this feedback loop, is that a collector current flowing in one of the collectors of the split ring collector transistor tends to cause an equal current to flow in the other collector of the split ring collector transistor. Therefore, the current flowing from electrode 93 will always tend to be equal to the current flowing from electrode 94. This is because of the symmetrical geometric construction of the split ring collector and the fact that the same base emitter bias voltage exists for both collectors of transistor 90. A similar result can be obtained by using two independent PNP transistors and connecting their emitters together and also connecting their bases together, however, a split ring collector is used in this particular embodiment because transistor characteristics are more closely matched in this type of structure.

The operation of the feedback loop can now be explained. A DC voltage is presented to the bases of transistors 95 and 96 by pinched resistor 78, resistor 80, and diodes 81, 82 and 83. This voltage will tend to turn on transistors 95 and 96. When both of these transistors start to turn on, their base emitter voltages will be exactly the same because there will be negligable emitter current causing a voltage drop across resistors 97 and 98. However, transistor 95 is a double emitter transistor and will tend to draw twice as much emitter current as transistor 96 for the same base emitter voltage. Therefore, transistor 95 will tend to draw twice as much collector current as transistor 96. The source of transistor 95's collector current is collector 93, which is one collector of split ring collector transistor 90. As collector 93 tends to draw more current, collector terminal 94 will also tend to draw more current because of the symmetrical construction and bias of the split ring collector transistor. As collector terminal 94 draws more current, this means that the collector current of transistor 96 increases, and as the collector current of transistor 96 increases, the base emitter voltage across transistor 96 increases. As the base emitter voltage across transistor 96 increases, this causes the base emitter voltage across transistor 95 to increase which in turn causes an increase in the emitter current of transistor 95, and so the collector current of transistor 95 increases which causes an additional increase in the collector current of transistor 96. This constant increasing of collector currents of transistors 95 and 96 does level off when the emitter current of transistor 95 is large enough to cause a voltage drop across resistors 97 and 98 of 18mv at room temperature. In the final stable condition, the collector current of transistor 96 is equal to the collector current of transistor 95 and this is required because of the construction of split ring collector transistor 90.

Assuming an emitter current I flowing in transistor 96, this leads to a voltage $V_1$ being developed across the base emitter terminals of transistor 96. This relationship is expressed by the diode equation as:

$$I = I_s e^{\frac{qV_1}{kT}}.$$

Transistor 95 is a 2x emitter transistor and can be analyzed as a transistor consisting of two parallel identical base emitter diodes. Any other number multiple emitter transistor could be used for transistor 95 with similar results. The total emitter current of transistor 95 is equal to the total emitter current of transistor 96 since the collector currents of transistors 95 and 96 are equal. Therefore the current flowing in each of the parallel diodes which comprise the base emitter junction of transistor 95 is equal to I/2. By the diode equation $$I/2 = I_s e^{\frac{qV_2}{kT}}.$$

Where $V_2$ is the base emitter voltage of transistor 95. $I_s$ represents the leakage current of the base emitter diode, and because all diodes are of similar construction, $I_s$ is the same for the base emitter diodes of transistors 95 and 96. By dividing the two previously determined equations for emitter current of the base emitter diodes of transistors 95 and 96, and taking the natural logarithm of both sides of the end result; it is seen that $V_1-V_2 = (kT/q)(\log_e 2)$, which at room temperature is equal to 18 milivolts. $V_1$ is equal to $V_2$ plus the total emitter current of transistor 95 times the combination of resistors 97 and 98. The total emitter current flowing in transistors 95 can be shown to be: $I = (kT/q)(\log_e 2)/(\text{resistor } 97 + \text{resistor } 98)$. At room temperature this means that the emitter current in transistor 95 is equal to 18 milivolts divided by the series resistance of resistors 97 and 98. Therefore the current I depends only on the value of resistors 97 and 98 and not on the value of the voltage power supply.

The biasing of transistor 90 by using forward biased PN junctions referenced to the power supply voltage, is done to keep transistor 90 independent of base width modulation effects caused by power supply variations. By making resistor 98 an adjustable resistor, it is possible by the foregoing circuitry to generate a stable adjustable current which is independent of power supply value as long as a sufficient power supply value exists to correctly bias transistors 90, 95 and 96. In the present embodiment adjustable resistor 98 is contemplated as being a resistor external to the monolithic integrated circuit.

The base emitter voltage of transistor 96 is also applied across diode connected transistor 84 and generates a current I in diode 84, equal to the emitter current in transistor 96, since diode 84 has the same bias as the base emitter diode of transistor 96. The equal currents flowing in the emitter of transistor 96, in the emitter of transistor 95, and through diode 84 are summed together by diode connected transistor 99. Therefore the anode to cathode voltage across diode 99 represents the voltage developed across a diode when a current equal to 3I is passed through it. Thus the voltage applied to terminal 100, which is connected to the anode of diode 99, represents the base emitter voltage necessary to bias a transistor to conduct a current equal to 3I. The transistor that is biased by this voltage is transistor 49, which in this embodiment is a 4x emitter transistor, therefore the actual current controlled by the voltage at terminal 100 is equal to 12I. Diode 99 performs a current saving operation because it combines both of the currents generated in the feedback loop and the current generated in diode 84 (which is used to form the base of a stable diode voltage string); and therefore a voltage which can control a current equal to 3I is generated without generating any additional unnecessary current. The 4x emitter of transistor 49 performs an additional current multiplication and therefore provides current saving and supplies the IF amplifier with 12 times the current developed in each of the arms of the original current mirror feedback amplifier.

Diode 84 is not part of the current feedback loop. Diode 84's current comes from diode 83 less the negligable amount of current drawn by transistors 95 and 96. The voltage at the base of transistor 75 is constant and independent of voltage supply value, and consists of; the voltage drop across resistor 80, the voltage drop across diodes 81, 82, 83 and 84 and the voltage drop across diode 99. All of these components have constant currents running through them. Diode 99 has a constant current of 3I, whereas components 80, 81, 82, 83 and 84 all carry a constant current of I. The voltage at terminal 101 is merely the voltage at the base of transistor 75 plus the base emitter drop of transistor 75. Thus the voltage at terminal 101 is almost totally independent of the power supply value, and remains constant with respect to ground, as long as the power supply voltage remains above a certain minimum value. The voltage present at terminal 101 is AC coupled to ground by the emitter to collector resistance of transistor 75, which is another example of a semiconductor device being used to give a low AC impedance, while maintaining a DC offset value.

Important temperature compensation is accomplished by the current mirror feedback circuit. The current generated in the current mirror is $I = (kT/Q)(\log_e 2)/(\text{resistor } 97 + \text{resistor } 98)$. The gain of each cascode stage is the load resistance divided by $r_e$ of the input device of each stage; and $r_e = (kT/q)/I_e$ is the emitter current of the input transistor of each stage. Constant current source 49 controls a current equal to 12I, which is equally split between transistors 40 and 47, and thus supplies the emitter currents of cascode stages 25, 30 and 35. The temperature variation of $r_e$ of each stage is therefore the same as the temperature variation of the series combination of resistors 97 and 98. Therefore by adjusting the temperature coefficient of resistance of external resistor 98 and the relative values of resistors 98 and 97, it is possible to compensate the voltage gain of the IF amplifier for temperature variations. This is possible because the temperature variation of the voltage gain of each cascode stage is equal to the temperature variation of the load resistance divided by the temperature variation of $r_e$.

As can now be seen, a monolithic integrated circuit IF amplifier has been disclosed, which has voltage gain practically independent of temperature variation, voltage supply variation, and is able to handle large input amplitude signals. The amplifier consists of three cascode stages of amplification and maintains high frequency response, low noise characteristics and high gain. The gain of the amplifier is maintained at a stable value by the use of a constant current source for controlling the current in each of the cascode stages and the use of a stable DC reference potential with respect to ground which is independent of power supply variations. A novel cascade-cascode stacking technique is disclosed, which minimizes the total current drain and minimizes the value of DC reference potential needed to bias the cascode amplifiers, while permitting direct coupling of the three cascode stages. The use of semiconductor devices to AC couple to ground while maintaining a stable DC voltage difference between two points of circuiry has also been disclosed. A current mirror feedback amplifier which generates currents that are independent of power supply value has also been disclosed and the temperature variation of the voltage independent current, generated by this current mirror, has been used to temperature compensate the voltage gain of a cascode amplifier.

While I have shown and described a specific embodiment of this invention, further modiciations and improvement will occur to those skilled in the art. I desire it to be understood, therefore, that this invention is not limited to the particular form shown and I intend in the appended claims to cover all modifications which do not depart from the spirit and scope of this invention.

I claim:

1. An amplifier circuit stage comprising:
    a first, second, and third amplifier means wherein each amplifier means has a signal input terminal, an amplified signal output terminal, a DC operating current receiving terminal, and a DC operating current return terminal;
    the input terminal of said second amplifier means coupled to the output terminal of said first amplifier means, the output terminal of said second amplifier means coupled to the input terminal of said third amplifier means, and the return terminal of said third amplifier means connected to the receiving terminal of said first amplifier;
    a first transistor with one of its emitter and collector electrodes coupled to the return terminal of said first amplifier means and the other of its emitter and collector electrodes coupled to the return terminal of said second amplifier means;
    a DC constant current source means coupled to said first, second, and third amplifier means and said transistor for determining the total combined current therethrough;
    means for supplying DC operating current to the receiving terminals of said second and said third amplifier means; and
    circuit means for supplying base bias to said first transistor,
    whereby said constant current source means determines the combined DC operating current of said first, second and third amplifier means and said circuit means and said first transistor determine the current division.

2. An amplifier circuit stage comprising:
    a first cascode amplifier comprising a first and second transistor with said first transistor being the input device and having its collector coupled to the emitter of said second transistor and its base adaptable for receiving an input signal, the collector of said second transistor coupled to a load for supplying an amplified signal thereto;
    a DC load means coupled in parallel with said cascode amplifier for drawing a current in a path which is parallel to the path of the emitter current of said first transistor;
    a DC constant current source means coupled to said cascode amplifier and said DC load for controlling the current therethrough; and
    bias means coupled to said first, and second transistors, said DC load and said current means for supplying operating potentials thereto for operating said cascode stage as a common emitter feeding a common base amplifier with its gain controlled by the constant current source, whereby said DC load means provides an alternate current path for said constant current source means and thereby provides said cascode stage with a large signal handling capability.

3. The amplifier circuit according to claim 2 which includes an AC coupling means coupled in parallel with said constant current source means for reducing the noise and AC resistance contributed by said current source means.

4. The circuit defined in claim 1 which includes AC coupling means comprising a capacitor coupled in parallel with said constant current source means.

5. The circuit defined in claim 4 wherein said first, second, and third amplifier means each includes a cascode transistor amplifier comprising:
   an input transistor with its base coupled to the input terminal of said amplifier means and with its emitter coupled to the return terminal of said amplifier means;
   an output transistor with its emitter coupled to the collector of said input transistor and its collector coupled to the output of said amplifier means;
   a load having two terminals with its first terminal coupled to the collector of said output transistor and its second terminal coupled to the receiving terminal of said amplifier means; and
   bias and AC ground means for operating each of said amplifier means as a cathode common emitter - common base amplifier.

6. The circuit of claim 5 wherein said constant current source means comprises a second transistor with its collector coupled to the return terminal of said first amplifier means, with its emitter coupled to ground, and with its base connected to a DC controlling potential that determines the emitter current in said second transistor.

7. The circuit defined in claim 6 which includes a current mirror feedback circuit for creating two constant currents and a first diode for summing these currents and creating said DC controlling potential.

8. The circuit defined in claim 7 wherein the said supplying means for supplying DC current to the receiving terminal of said second amplifier means includes; a third transistor with its emitter connected to the receiving terminal of said second amplifier means, with its collector connected to a DC potential, and with its base connected to a stable DC reference potential and the base of said output transistor of said third amplifier means whereby said stable reference potential provides a stable bias voltage for the amplifier circuit stage.

9. The circuit defined in claim 8 which includes a fourth transistor having its base emitter junction in series with a series connection of components which conduct constant currents, the base emitter voltage of said fourth transistor and the voltage drop of said series connected components providing a stable voltage as said DC reference potential.

10. An amplifier circuit stage comprising:
   a first cascode amplifier stage comprising a first and second transistor with said first transistor being the input device and having its base adaptable for receiving an input signal and its collector coupled to the emitter of said second transistor, the collector of said second transistor coupled to a load;
   a third transistor with its emitter coupled to the emitter of said first transistor;
   a DC constant current source coupled to the emitters of said first and third transistors;
   AC coupling means for coupling the emitters of said first and third transistors to ground; and
   bias means coupled to said first, second, and third transistors for supplying bias operating potentials thereto or operating said cascode stage as a common emitter feeding a common base amplifier with its gain controlled by the constant current source whereby said third transistor provides an alternate current path for said constant current source and thereby provides said cascode stage with a large signal handling capability.

11. The circuit defined in claim 10 wherein the AC coupling means for coupling the emitters of said first and third transistors to ground is a capacitor.

12. The circuit defined in claim 11 wherein the DC constant current source coupled to the emitters of said first and third transistors comprises a fourth transistor having its collector coupled to the emitters of said first and third transistors, having its emitter connected to ground, and having its base connected to a DC reference voltage.

13. The circuit defined in claim 12 wherein said fourth transistor is a multiple emitter transistor.

14. The circuit defined in claim 10 wherein the bias means includes a first biasing resistor connected from the collector of said third transistor to the base of said third transistor, and a second biasing resistor being connected from the collector of said third transistor to the base of said first transistor.

15. The circuit defined in claim 14 wherein said first and second biasing resistors are approximately equal and one of said biasing resistors is adjustable.

16. The circuit defined in claim 15 wherein all the components except the adjustable biasing resistor and said AC coupling means are contained on a single integrated circuit chip.

17. The circuit as described in claim 16 wherein the components are chosen for low noise IF amplification at a frequency of 5 to 22 MHZ.

18. The circuit defined in claim 10 wherein said bias means for said third transistor includes an amplifier having its current return terminal connected to the collector of said third transistor.

19. The circuit defined in claim 10 which includes a second AC coupling means for coupling the base of said second transistor and the collector of said third transistor to AC ground, said second coupling means comprising a diode connected between said base and said collector and only one capacitor connected to one electrode of said diode.

* * * * *